United States Patent [19]

Balfour et al.

[11] Patent Number: 5,043,362

[45] Date of Patent: Aug. 27, 1991

[54] PHOTOPOLYMERIZABLE COMPOSITIONS

[75] Inventors: Ross A. Balfour; John A. Sperry, both of Oxon, Great Britain

[73] Assignee: Autotype International Limited, Wantage, England

[21] Appl. No.: 212,595

[22] Filed: Jun. 28, 1988

[30] Foreign Application Priority Data

Jul. 11, 1987 [GB] United Kingdom ............... 8716378

[51] Int. Cl.$^5$ ...................... C08L 33/06; C08L 35/02; C08F 283/04
[52] U.S. Cl. ...................................... 522/14; 522/106; 522/95; 522/102; 522/904; 525/455; 525/227; 525/217
[58] Field of Search ................... 522/14, 106, 95, 102, 522/904

[56] References Cited

U.S. PATENT DOCUMENTS 4,228,232  10/1980  Rousseau ............................... 522/14
4,418,138  11/1983  Curtis .................................... 522/14
4,523,983   6/1985  Lin ....................................... 522/106

FOREIGN PATENT DOCUMENTS 2109392  6/1983  United Kingdom .

Primary Examiner—Marion E. McCamish
Assistant Examiner—Susan Berman
Attorney, Agent, or Firm—Marjama & Pincelli

[57] ABSTRACT

Water-processable screenprinting stencils and resists are based upon photopolymerizable systems in which the hydrogen donor compound is a modified polyvinylalcohol having pendant dialkylamino groups.

11 Claims, No Drawings

PHOTOPOLYMERIZABLE COMPOSITIONS

This invention is concerned with water-based photopolymerizable compositions. Photosensitive resin compositions have long been used in various ways, for instance (1) in the preparation of many types of printing forms, (2) as resists for the subsequent plating or etching of substrates in the preparation of printed circuit boards and (3) in the manufacture of UV-curable inks and varnishes.

Water-soluble or water-processable resist materials are very desirable, because of their inherent safety of handling at the preparation stage and the subsequent ease of processing after exposure to actinic light. Water-soluble polymers can be used in these applications, usually after admixture with suitable low-molecular-weight unsaturated compounds which are capable of vinyl polymerization, together with a photoinitiator which gives free radicals and thus causes polymerization of the unsaturated compound. If the vinyl monomer contains more than one unsaturated group, cross-linking can occur. The inert polymer becomes trapped in the matrix of the cross-linked polymer, thus increasing the efficiency of the photoreaction. The "polymerizing system" can be wholly dissolved in an aqueous colloidal solution, as described in GB-PS 1,307,995, or, even if it is insoluble, it may be capable of dispersion in the aqueous colloidal solution by the use of suitable surfactants, together with high-speed agitation, as described in GB-PS 2,109,392.

For greatly improved efficiency in the hardening process, it is very desirable for the polymer chains of the water-soluble high-molecular-weight polymer to be capable of participating directly in the polymerization reaction. When this occurs and the polymer chains themselves crosslink, the molecular weight of the resultant cross-linked polymer rises very rapidly, from the inception of the reaction, and the overall efficiency of the photoreaction is greatly increased. EP-A-0249306 discloses the preparation and use of polyvinyl alcohol, in which a proportion of the hydroxyl groups are replaced by ether-linked unsaturated groups of the formula:

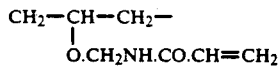

thus providing sites for participation in the photoreaction. The chemistry of photopolymerization, although rather complex, is now well understood. There are two main types of radical photoinitiators, namely those which produce initiator radicals from the reactive excited state by cleavage of the molecule (intramolecular photocleavage) and those which react by hydrogen abstraction from a suitable donor molecule which, in turn, thus becomes a free radical in its own right and becomes capable of participating in the subsequent photoreaction (intermolecular initiation).

One of the most suitable groups which acts as a hydrogen donor in such an intermolecular initiation reaction is the dimethylamino group, $(CH_3)_2N-$.

This invention is based upon the discovery that a very efficient photopolymerisable system can be based upon the use of a modified form of polyvinylalcohol.

According to this invention, a photopolymerizable system is provided, which comprises:

(a) a hydrogen-abstracting photoinitiator,
(b) a compound containing more than one unsaturated group capable of radical polymerization, and
(c) a compound containing a hydrogen donor group, and is characterized in that the compound (c) comprises a polyvinylalcohol in which a proportion of the hydroxyl-groups are substituted so as to give pendant dialkylamino groups.

In this system, the polymer chains themselves participate in the photoreaction, initially brought about by hydrogen abstraction from one of the alkyl groups by the irradiated photoinitiator (a), and very efficient photohardening of the coated layer ensues. The efficiency of the reaction is such that only a low level of substitution of available hydroxyl groups is required to give efficient hardening, leaving intact on the polymer sufficient numbers of hydroxyl groups to maintain good water-solubility. This allows the system to be handled as a water-solution in the preparation stages and also allows plain water development of the exposed resist.

Photoinitiators suitable for use in the photosensitive compositions of the invention include those compounds which, on exposure to actinic radiation, generate free radicals by intermolecular hydrogen abstraction. Generally, these compounds are ketones and are typified by benzophenone, thioxanthone and quinone derivatives. It is a preferred feature of the invention that the photographic speed of the resist which is the subject of the invention is dependent upon the photo-activity of the chosen photoinitiator. It can therefore be varied between wide limits. Unsaturated compounds containing more than one unsaturated group capable of radical polymerization include the epoxy-acrylates, urethane-acrylates, polyester-acrylates, polyether-acrylates, the corresponding methacrylates and the corresponding bisacrylamides and bismethacrylamides.

It is a surprising feature of this invention that both water-soluble and water-insoluble unsaturated compounds can be used. In the case of water-insoluble monomers, water-insoluble or water-soluble photoinitiators may then also be used; generally in the former case, the photoinitiator is dissolved in the monomer and the solution is dispersed by vigorous agitation in the aqueous colloid solution. Alternatively, the invention works equally well if a water-soluble monomer and a water-soluble photoinitiator are selected, or both types may be admixed in the system. Water-insoluble photoinitiators together with water-soluble monomers give the poorest results of the possible combinations and therefore are not generally recommended.

The polyvinylalcohol of commerce is manufactured by the hydrolysis of polyvinylacetate. The hydrolysis may be allowed to go to completion or it may be terminated at an intermediate stage. Therefore, commercial polyvinylalcohol may contain a greater or lesser proportion of acetate groups. It is also available in a range of molecular weight grades. Polyvinylalcohol is particularly attractive in the preparation of printing forms, because it is very resistant to the usual range of organic solvents used in inks.

Dried and hardened polyvinylalcohol films are readily removed by the application of an aqueous periodate solution, as described in GB-PS 1,375,402, and these properties are not affected at the level of substitution of dialkylamino groups required in the polymer.

It is normally quite difficult to prepare derivatives of polyvinylalcohol economically. The polymer is soluble in water and water-alcohol mixtures only, which precludes the use of acid chlorides or anhydrides, or it may be swollen by such solvents as pyridine. In all cases, the most difficult step is isolation and purification of the required derivative; the process usually requires solution and precipitation, often several times over.

As part of this invention, it has been discovered that modification of polyvinylalcohol to provide a suitable substituted polymer may easily be carried out heterogeneously. The polyvinylalcohol is used as a fine-powdered grade which is dispersed in a non-solvent, together with a dialkylaminobenzaldehyde. After a suitable reaction time, the substituted polymer is simply filtered off, washed with a suitable solvent and dried. This therefore represents a considerable improvement over previous methods and provides a cheap and convenient way of producing modified polyvinylalcohol, suitable for use in photoresists based upon the photopolymerisable systems of the invention herein described. The polyvinylalcohol used may be any grade of fully or partially-hydrolyzed polyvinylacetate, i.e. it may contain a proportion of acetate groups. Any powder grade may be used, but it has been found that the best results are obtained from powder passing an 80-mesh sieve, i.e. below 175 microns ($\mu$m). The dialkylaminobenzaldehyde may be substituted by other groups on the available carbon atoms of the benzene ring. These include alkyl, alkoxy, halogen, CN and OH groups.

The reaction is catalyzed by the addition of a small amount of acid; although not limiting, 0.1% to 10% of acid by weight of the dialkylaminobenzaldehyde is preferred.

In order that the invention may be fully appreciated, it is illustrated by the following Examples, in which Example 1 relates to modification of polyvinylalcohol, Example 2 relates to preparation of a light-sensitive, i.e. photopolymerizable system based upon the product of Example 1, and Example 3 shows how a screenprinting stencil may be made.

EXAMPLE 1

Preparation of dialkylamino-substituted polyvinylalcohol

| "Gohsenol GH17s" polyvinylalcohol (1) | 3.00 Kg |
|---|---|
| 4-dimethylaminobenzaldehyde | 0.18 Kg |
| Isopropylalcohol | 15.00 Kg |
| Concentrated hydrochloric acid | 0.24 Kg |

(1) 88% hydrolysed polyvinylacetate; degree of polymerisation = 1700; "GOHSENOL" is a Regd. Trademark (Nippon Gohsei).

The above ingredients were stirred for 1 hour at 80° C. and then neutralized by the addition of:

| Triethanolamine | 0.60 Kg |
|---|---|
| Isopropylalcohol | 3.00 Kg |

The polyvinylalcohol derivative was filtered and washed with 10 Kg of ethanol. The filter cake was then slurried with 15 Kg of warm ethanol and refiltered to remove impurities, followed by air drying.

Infrared analysis of a thin film of this grafted polyvinylalcohol, in comparison with unmodified polyvinylalcohol, revealed the presence of sharp peaks at 1520 and 1610 cm$^{-1}$, indicative of aromatic absorbance.

EXAMPLE 2

Preparation of a light-sensitive composition containing dimethylamino-substituted polyvinylalcohol

| Premix A | |
|---|---|
| 10% aqueous solution of polyvinylalcohol derivative, prepared as in Example 1 | 100 g |
| Monoacetin | 3.0 g |
| "Unisperse Blue GP" (2) | 0.1 g |
| Bisacrylamidoacetic acid, sodium salt | 1.0 g |
| Premix B | |
| Pentaerythritoltriacrylate | 10.0 g |
| Dibutylphthallate | 3.0 g |
| "Quantacure ITX" (3) | 0.4 g |

(2) Aqueous pigment dispersion; "UNISPERSE" is a Regd. Trademark (Ciba-Geigy).
(3) Isopropylthioxanthone; "QUANTACUR" is a Regd. Trademark (Ward Blenkinsop).

Premix B was added to Premix A and emulsified by use of a high shear blender, to produce an aqueous photosensitive emulsion.

EXAMPLE 3

Preparation of a stencil for screenprinting

The photosensitive emulsion prepared according to Example 2 was applied, two coats on each side, to a 90 threads per cm polyester screenprinting mesh by means of a coating trough. After drying, it was exposed to a 5KW medium pressure Hg lamp at a distance of 100 cm for 2 minutes, through a photographic positive which comprised a "Kodak" 0.1 density increment stepwedge and a series of lines ranging in thickness from 5 mm down to 100 $\mu$m. ("KODAK" is a Regd. Trademark). Upon development with running water, a negative image of the original was obtained which showed insolubilisation of the first eight steps of the stepwedge. After drying, the resultant stencil was used to screen print 1000 copies of the original with a solvent-based screenprinting ink. After removal of excess ink by washing with solvent, the stencil was easily removed from the mesh by soaking in a 1% aqueous solution of sodium metaperiodate, followed by washing with water.

We claim:
1. A photopolymerisable system suitable for use in coating a screenprinting mesh comprising:
   (a) a hydrogen-abstracting photoinitiator,
   (b) a compound containing more than one unsaturated group capable of radical polymerization and
   (c) a compound containing a hydrogen donor group, characterized in that the compound (c) comprises a polyvinylalcohol in which a proportion of the hydroxyl-groups are substituted so as to give pendant dialkylamino groups.

2. A photopolymerizable system according to claim 1, in which the photoinitiator (a) is selected from benzophenone, thioxanthone and quinone derivatives.

3. A photopolymerizable system according to claim 1, in which the unsaturated compound (b) is selected from epoxy-acrylates, urethane acrylates, polyester acrylates, polyether acrylates, the corresponding methacrylates and bisacrylamides and dismethacrylamides.

4. A photopolymerizable system according to claim 1, in which the unsaturated compound (b) is water-soluble or water-insoluble and the initiator (a) is water-soluble.

5. A photopolymerizable system according to claim 1, in which the unsaturated compound (b) is water-soluble and the initiator (a) is water-insoluble.

6. A photopolymerizable system according to claim 1, in which the compound is first prepared by the heterogeneous modification of polyvinylalcohol.

7. A photopolymerizable system according to claim 6, in which finely-powdered polyvinylalcohol is dispersed in a non-solvent and contacted with a dialkylaminobenzaldehyde for a time sufficient to effect the modification reaction.

8. A photopolymerizable system according to claim 7, in which the dialkylaminobenzaldehyde has one or more substituents selected from alkyl, alkoxy, halogen, CN and OH groups on the available carbon atoms of the benzene ring.

9. A photopolymerizable system according to claim 7, in which the powdered polyvinylalcohol has a particle size below 175 μm.

10. A photopolymerizable system according to claim 1, in which the polyvinylalcohol contains acetate groups.

11. A photopolymerizable system according to claim 7, in which preparation of the modified polyvinylalcohol is catalyzed by means of 0.1% to 10% of acid by weight of the dialkylaminobenzaldehyde.

* * * * *